US007827023B2

(12) United States Patent
Beausoleil et al.

(10) Patent No.: US 7,827,023 B2
(45) Date of Patent: Nov. 2, 2010

(54) METHOD AND APPARATUS FOR INCREASING THE EFFICIENCY OF AN EMULATION ENGINE

(75) Inventors: William F. Beausoleil, Hopewell Junction, NY (US); Beshara G. Elmufdi, Sunnyvale, CA (US); Mitchell G. Poplack, San Jose, CA (US); Tai Su, Hyde Park, NY (US)

(73) Assignee: Cadence Design Systems, Inc., San Jose, CA (US)

( * ) Notice: Subject to any disclaimer, the term of this patent is extended or adjusted under 35 U.S.C. 154(b) by 599 days.

(21) Appl. No.: 11/344,766

(22) Filed: Feb. 1, 2006

(65) Prior Publication Data

US 2007/0179772 A1  Aug. 2, 2007

(51) Int. Cl.
*G06F 17/50* (2006.01)
*G06F 9/455* (2006.01)
*G06F 13/36* (2006.01)
*G06F 9/44* (2006.01)
*G06F 9/45* (2006.01)
*H03K 17/693* (2006.01)
*H03K 19/00* (2006.01)

(52) U.S. Cl. .............................. 703/24; 703/13; 703/26; 703/28; 710/312; 717/135; 717/138; 716/16; 716/17

(58) Field of Classification Search .................. 703/24; 710/312; 713/100; 717/135, 138
See application file for complete search history.

(56) References Cited

U.S. PATENT DOCUMENTS 5,329,470 A * 7/1994 Sample et al. ................ 703/28

| 5,551,013 | A | | 8/1996 | Beausoleil et al. |
| 5,805,915 | A | * | 9/1998 | Wilkinson et al. ............ 712/20 |
| 5,946,219 | A | * | 8/1999 | Mason et al. ................. 716/16 |
| 5,963,735 | A | * | 10/1999 | Sample et al. ................ 703/24 |
| 6,021,490 | A | * | 2/2000 | Vorbach et al. ............. 713/100 |
| 6,333,641 | B1 | * | 12/2001 | Wasson ....................... 326/39 |
| 6,391,489 | B1 | * | 5/2002 | Winch et al. ................ 429/121 |
| 6,618,698 | B1 | | 9/2003 | Beausoleil et al. |
| 6,931,489 | B2 | * | 8/2005 | DeLano et al. .............. 711/122 |
| 2003/0130834 | A1 | * | 7/2003 | Krishnan ..................... 703/26 |

OTHER PUBLICATIONS

Ghare et al. "Dynamic Reconfiguration of a PMMLA for High-Throughput Applications" 1998.*

(Continued)

*Primary Examiner*—Kamini S Shah
*Assistant Examiner*—S. Patel
(74) *Attorney, Agent, or Firm*—Moser IP Law Group

(57) ABSTRACT

A method and apparatus for a memory efficient hardware emulator. The emulator comprises a plurality of processor dusters having data within the duster is stored in at least one data array, where the at least one data array comprises a plurality of sub-arrays. The sub-arrays that are not of uniform size (e.g., the size of each sub-array is determined by the probability that a particular sub-array will be accessed by the processor during a future emulation step). For example, at least one first sub-array is equal in depth to instruction memory within a processor (i.e., equal to the number of instructions in an emulation cycle), and the remaining sub-arrays are a fractional depth of the first sub-array.

22 Claims, 5 Drawing Sheets

OTHER PUBLICATIONS

Mai, Ken. "Design and Analysis of Reconfigurable Memories", Jun. 2005.*

Jones et al. "A Time-Multiplexed FPGA Architecture for Logic Emulation", IEEE 1995, Custom Integrated Circuits Conference.*

Tatineni et al. "Dynamic Scheduling, Allocation, and Compaction Scheme for Real-Time Tasks on FPGAs", May 2002.*

Tau, et al. "A First Generation DPGA Implementation", Third Canadien Workshop of Field Programmable Devices, 1995.*

\* cited by examiner

METHOD AND APPARATUS FOR INCREASING THE EFFICIENCY OF AN EMULATION ENGINE

BACKGROUND OF THE INVENTION

1. Field of the Invention

Embodiments of the present invention generally relate to a simulation acceleration technique or an emulation engine used in emulating a system composed of logic gates, and more particularly, to a method and apparatus for improving the efficiency of system emulation.

2. Description of the Related Art

Hardware emulators are programmable devices used in the verification of hardware designs. A common method of hardware design verification is to use a processor-based hardware emulator to emulate the design. These processor-based emulators sequentially evaluate combinatorial logic levels, starting at the inputs and proceeding to the outputs of a circuit. Each pass through the entire set of logic levels is known as a cycle; the evaluation of each individual logic level is known as an emulation step.

An exemplary hardware emulator is described in commonly assigned U.S. Pat. No. 6,618,698 titled "Clustered Processors In An Emulation Engine", which is hereby incorporated by reference in its entirety. Hardware emulators allow engineers and hardware designers to test and verify the operation of an integrated circuit, an entire board of integrated circuits, or an entire system without having to first physically fabricate the hardware.

The complexity and number of logic gates present on an integrated circuit has increased significantly in the past several years. Moore's Law predicts the number of transistors or gates present in an integrated circuit will double every two years. Hardware emulators need to improve in efficiency to keep pace with the increased complexity of integrated circuits.

A hardware emulator is comprised of multiple processors. The processors are arranged into groups of processors known as clusters, and the clusters of processors collectively comprise the emulation engine. Each processor is capable of emulating one or more logic gates, mimicking the function of logic gates in an integrated circuit. The processors are arranged to compute results in parallel, in the same way logic gates present in an integrated circuit compute many results in parallel.

The output of a processor or input to the emulator is stored in a memory known as a data array such that the output can be used by the processor, another processor or some other device. The data array has a single read/write port. The output from a read port of the data array provides a single bit of input to a processor. A typical processor has, for example, four inputs. Processors are generally grouped together into clusters and share a data array. Each of the processors produces one output per instruction during each emulation step. A data array coupled to N processors (where N is an integer and each processor has four inputs) must write N bits (1-bit output from each of the N processors) and have 4×N 1-bit read ports to supply four input bits to each of the N processors. Since conventional memory devices do not have multiple ports, a plurality of memory devices (each having one read/write port) are arranged in parallel to have the same N-bit data written to each device during the write cycle and during the read cycle a single bit is provided to one of the processor's inputs. The data stored in each of the memory devices in the cluster is identical and the emulator selectively accesses the data that is to be coupled to each processor. Thus, any one processor in the cluster can access any of the data available to any other processor in the cluster. Unfortunately, as the number of instructions processed per emulation cycle increases, the amount of processor output increases and the corresponding size of the data array must also increase. Each additional instruction within an emulation cycle requires an additional N-bit word to be stored in each memory device. Thus, in an emulator using N four input processors, each additional instruction within an emulation cycle requires 4×N additional bits of storage in the data array. The cost of adding extra data array memory is a significant factor that affects the overall cost of a hardware emulator.

Therefore, there is a need in the art for a method and apparatus that improves the number of instructions a processor can execute per cycle without the significant cost increase attributed to adding data array memory.

SUMMARY OF THE INVENTION

The present invention generally relates to an improved processor-based emulation engine. The emulation engine is composed of a plurality of processors, each processor capable of emulating one or more logic gates. The processors are arranged into groups of processors known as clusters. Each processor in a cluster has access to the output of all the other processors in the cluster, and a cluster has access to the output of all the other clusters within the emulation engine. Data within the cluster is stored in at least one data array, where the at least one data array comprises a plurality of sub-arrays. The present invention improves upon previous emulation engines by including sub-arrays within a data array that are not of uniform size (e.g., the size of each sub-array is determined by the probability that a particular sub-array will be accessed by a processor during a future emulation step). In one embodiment of the invention, at least one first sub-array is equal in depth to instruction memory within a processor (i.e., equal to the number of instructions in an emulation cycle), and the remaining sub-arrays are a fractional depth of the first sub-array.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

The present invention is an improved method and apparatus for increasing the efficiency of an emulation engine. An exemplary emulation engine is disclosed in U.S. Pat. No. 6,618,698 "Clustered Processors In An Emulation Engine"

and U.S. Pat. No. 5,551,013 "Multiprocessor For Hardware Emulation" which are hereby incorporated by reference in their entirety.

Figure 1:
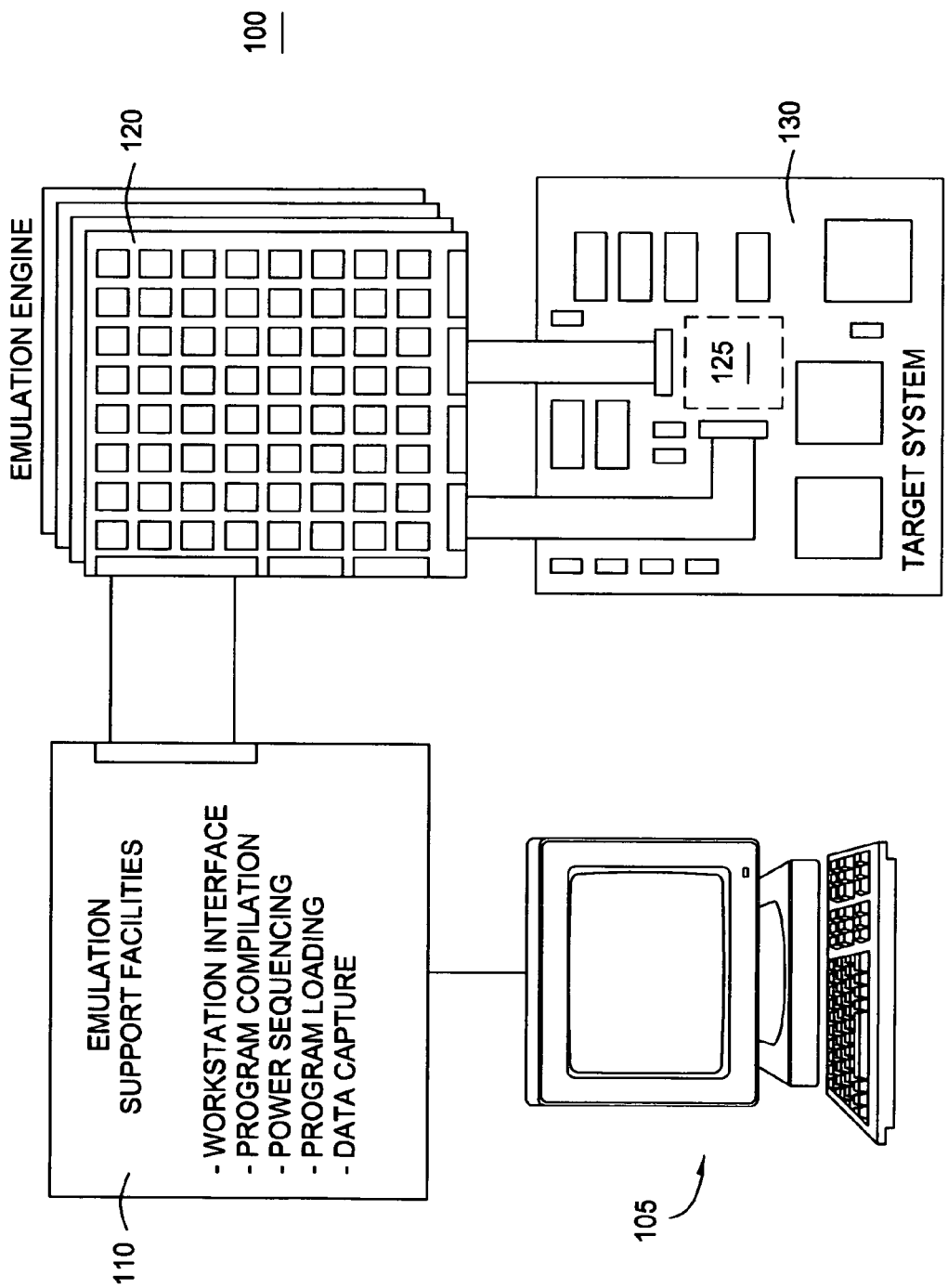
FIG. 1 is an overview of an emulation system.

FIG. 1 is an overview of an emulation system 100. The system 100 comprises a computer workstation 105, emulation support facilities 110, an emulation engine 120 and a target system 130. The computer workstation 105 is coupled to the emulation support facilities 110. The computer workstation 105 allows a user to interface with the emulation engine 120, control the emulation process and collect emulation results for analysis. The emulation support facilities 110 provide a workstation interface, program compilation, power sequencing, program loading and data capture. Programming information and data is loaded to the emulation engine 120 from the support facilities 110.

In response to the programming received from the emulation support facilities 110, the emulation engine 120 emulates a portion 125 of the target system 130. The portion 125 of the target system 130 may be an integrated circuit, a memory, a processor, or any object or device that can be emulated in a Hardware Description Language (HDL). Popular emulation languages include Verilog and VHDL.

Figure 2:
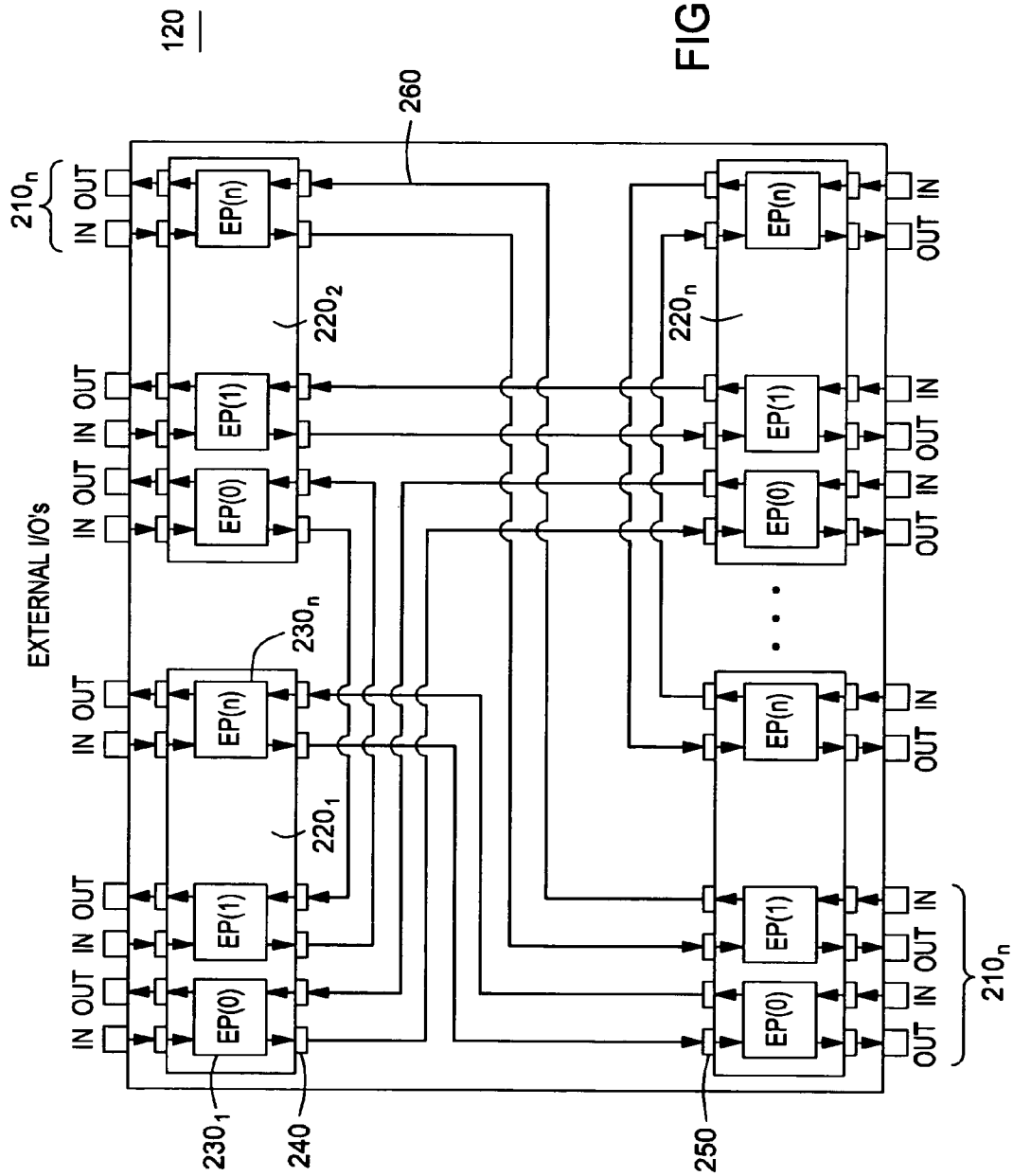
FIG. 2 is a block diagram of an emulation engine that is part of the emulation system.

FIG. 2 is a block diagram of an emulation engine 120. The emulation engine 120 comprises clusters 220 of processor modules 230. The emulation engine 120 communicates with the target system (130 in FIG. 1) and the emulation support facilities (110 in FIG. 1) through multiple inputs and outputs, collectively $210_n$ (where n is an integer). Each cluster 220 comprises multiple processor modules $230_n$ (where n is an integer) and multiple cluster inputs 250 and cluster outputs 240. The outputs 240 of each cluster 220 connect directly to the inputs 250 of the other clusters 220 within the emulation engine 120.

An emulation engine 120 contains multiple processor modules $230_n$. All processor modules $230_n$ within the emulation engine are identical. In one embodiment of the invention, a processor module $230_n$ emulates either a four input logic function, or a memory array access according to an emulation program provided by the emulation support facilities (110 in FIG. 1). The output data of a processor module $230_n$ is made available to other processor modules $230_n$ and processor module clusters 220 via interconnections 260 within the emulation engine 120.

Figure 3:
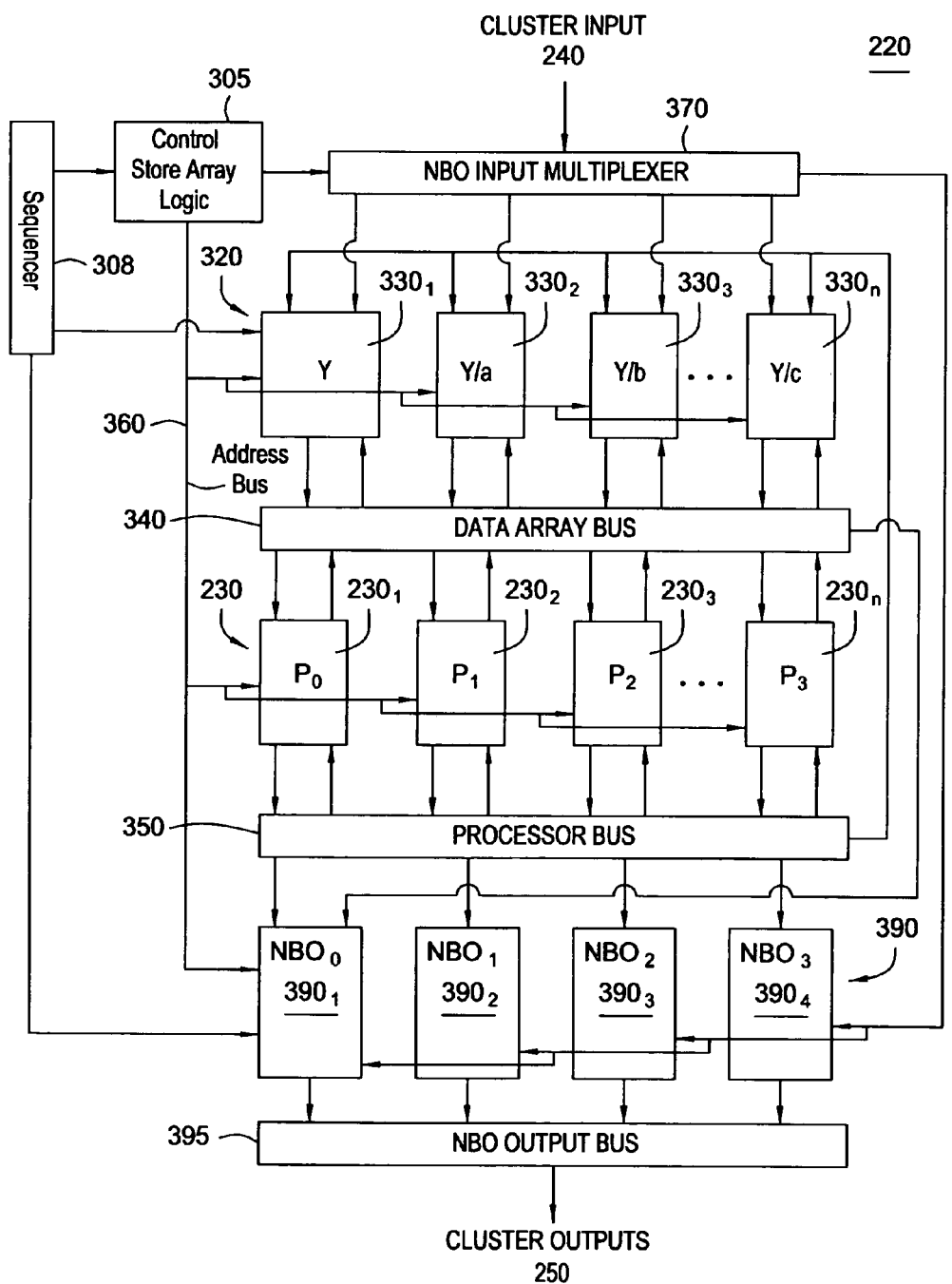
FIG. 3 is a block diagram of a multiprocessor based emulation engine that utilizes one embodiment of the present invention.

FIG. 3 is a detailed block diagram of a cluster 220. The cluster 220 comprises a plurality of processors $230_1 \ldots 230_n$ (collectively referred to as processors 230), a data array 320, a plurality of output arrays referred to herein as Node Bit Out (NBO) arrays $390_1, 390_2, 390_3 \ldots, 390_n$ (collectively referred to as NBO arrays 390), an NBO Input multiplexer 370, a control store array logic 305, and a sequencer 308. The data array 320 is divided into a plurality of sub-arrays $330_1, 330_2, 330_3, \ldots, 330_n$. The data array 320 is coupled to the processors 230 and the NBO arrays 390 via a data array bus 340. The processors 230 are coupled to the data array 320 and the NBO arrays 390 via the processor bus 350.

The embodiment of the invention depicted in FIG. 3 includes a plurality of NBO arrays 390 (i.e., processor output arrays that are distinct from the data arrays); however, the NBO arrays 390 are not necessary for the invention to function and are considered to be optional. Thus, an alternative embodiment of the invention does not include the NBO arrays 390 or the NBO input multiplexer 370. If an NBO array 390 is included, the operation of the NBO array is disclosed in detail within commonly assigned U.S. Patent Application Publication 2007-0198809, published Aug. 23, 2007, which is incorporated herein by reference in its entirety.

In one embodiment of the invention, the first sub-array $330_1$ has a depth of Y words, where each word comprises 1-bit of output data from each of N processors, i.e., an N-bit word. The remaining sub-arrays $330_2, 330_3, \ldots 330_n$ are of a fractional depth of Y words. Each sub-array $330_1$ to $330_n$ has a respective depth of Y, Y/a, Y/b or Y/c, where Y is equal to the number of steps the emulation engine is capable of emulating per cycle and a, b, and c are integer values. The values of a, b, and c may be different or equal. In one embodiment of the invention, the depth Y is equal to the depth of the control store array logic 305. The control store array logic 305 contains a sequence of instructions that control all functions performed by the various elements inside the processor cluster. Output data from the processor 230 is written sequentially using an address supplied from the control logic 305 to a unique location within the data array 320. The same data is simultaneously written to each sub-array $330_1, 330_2, 330_3 \ldots 330_n$. After Y steps, the first sub-array $330_1$ with a depth of Y words is full and new output data cannot be written to the first data sub-array $330_1$ without overwriting previously stored data. The remaining sub-arrays $330_2, 330_3, \ldots 330_n$ that have a fractional depth of Y words will become full before the completion of one emulation cycle. The history prior to the Y/a, Y/b or Y/c steps respectively will be lost.

The integers that define the depth of the sub-arrays $330_2, 330_3, \ldots 330_n$ are determined using a probabilistic analysis of the operation of a data array. The probabilistic analysis considers the probability of processed data stored in the data array 320 being requested by the processor 230 after a certain number of steps in an emulation cycle. This analysis may be based upon review of empirical data as well as review of the emulation process data requirements. The processors 230 generally evaluate gates in a sequential manner similar to the actual function performed by an integrated circuit where the logic gates are arranged in a tree format such that an output from one gate is coupled to another gate. A processor evaluates one gate in the tree on a particular step and, on the next step, another processor (or possibly the same processor) evaluates the next logic gate in the tree. The output of one processor generally feeds the input of another processor (or the same processor) in a sequential manner. When performing sequential evaluation of logic trees, a processor's input data is more likely to be recently generated than having been generated by a step from earlier in a cycle.

For example, if an emulation cycle has 512 steps, and the probability of processed data stored in the data array 320 being requested by the processor 230 after 256 steps of the emulation cycle is low, one or more of the sub-arrays $330_2, 330_3, \ldots 330_n$ can have a depth of, for example, 256 words. The processor 230 can request processed data from the sub-arrays $330_2, 330_3, \ldots 330_n$ for any of the prior 256 steps in the emulation cycle. Processed data generated by the first 256 steps of the emulation cycle is obtainable from the first sub-array $330_1$ and the processed data generated in the next 256 steps in the cycle are available from all the sub-arrays. Thus, the processed data from the most recent 256 steps in the emulation cycle is available to any of the processors 230 directly from a related sub-array 330. However, if, in the unlikely event, the processor $230_2, 230_3, \ldots 230_n$ requires data from a step earlier than the last 256 steps, the processor must retrieve the data from the first sub-array $330_1$ rather than sub-arrays $330_2, 330_3, \ldots 330_n$.

In one embodiment of the invention, a data array comprises one sub-array of depth Y words, and three additional sub-arrays of the depth Y/2 words. The sub-arrays are coupled to a processor comprising a control store word stack of a depth Y words. The combined depth of the sub-arrays is approximately 37.5% smaller than if all of the data arrays coupled to the processor were all of a depth Y words. In an embodiment where two sub-arrays store Y steps of data and two sub-arrays store Y/2 steps of data, the storage area savings is 25% compared to storing Y steps of data in all four sub-arrays. Thus, depending upon the embodiment, an emulation cycle can be increased by 37.5% or 25% more instructions without increasing the data array size.

In another embodiment of the invention using, for example, four processors having four inputs each, the memory required by the data array can be reduced by having the first sub-array store data for Y steps, the second sub-array store data for ¾ Y steps, the third sub-array store data for ½ Y steps and a fourth sub-array store data for ¼ Y steps. In this embodiment, a savings of 37.5% is realized, i.e., an emulation cycle can be increased by 37.5% more instructions without increasing the data array size.

The sequencer 308 is connected to the data array 320 the NBO arrays 390, and the control store array logic 305. For simplicity, the sequencer 308 is shown only connected to the first NBO array 390, in FIG. 3. The sequencer 308 provides timing information to the cluster 220, provides sequential write addresses to the data array, and causes the control store array logic 305 to sequentially output control words. The control words control the operations of the processors 230. The control store array logic 305 comprises a storage array. Each array stores control words that are sequentially and repetitively provided to the components of the cluster 220 under control of the sequencer 308. Each increment of the sequencer 308 causes the step value to advance from zero to a predetermined maximum value and corresponds to one design path dock cycle for the emulated design.

When an NBO array is used, the control words also determine which one of the cluster inputs 240 is selected by the NBO Input Multiplexer 370, the read address for the data array 320 and the read address for the NBO arrays 390. The data array bus 340 interconnects the data array 320, sub-arrays 330 and the processors 230 such that data from any processor 230 or sub-array 330 can be coupled to any other processor 230 or sub-array 330 within the cluster 220. The processor bus 350 interconnects the processors 230 and the NBO arrays 390 such that data generated by the processors 230 can be coupled to any processor 230 or any NBO array 390. The NBO output bus 395 interconnects the NBO arrays 390 within the duster 220. The NBO output bus 395 provides a cluster output 250 that can be coupled to other clusters 220 within the emulation engine.

An NBO input multiplexer 370 selectively couples a duster input 240 from the NBO output bus of other clusters of processors to the data array 320 and the NBO array 390. The sequencer 308 provides timing for writing the data to a memory location within the data array 320 and the NBO array 390

The processors 230 emulate one or more logic functions defined by a control word provided by the control store array logic 305. The processors 230 receive data input from the data array 320 via the data array bus 340 such that any stored data may be coupled to any processor 230. The processors 230 process the data using a function defined by the associated control store word.

The data out signal from a processor 230 is distributed to each of the other processors 230 and the data array 320. During any logic or memory operation, the data out signal of a processor 230 may be accessed by none, one, or all of the processors 230 within the cluster 220 (shown in FIG. 2).

Figure 4:
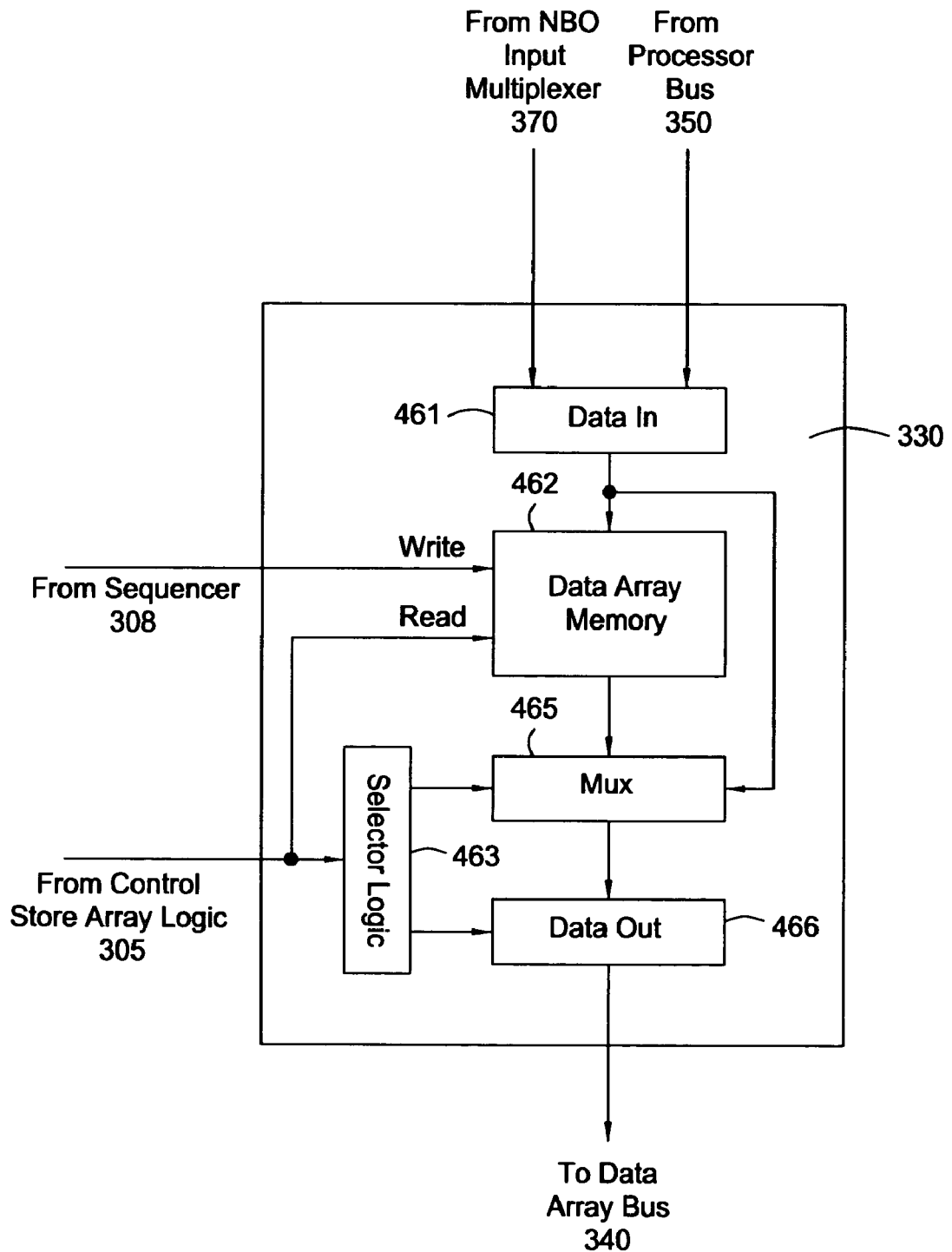
FIG. 4 is a block diagram of a data array.

FIG. 4 is a block diagram of a sub-array 330. Each of the sub-arrays are physically the same except for the depth of the data array memory 462, e.g., the data array memory 462 is deeper (larger) within the sub-array $330_1$ than within the sub-array $330_2$, $330_3$. The sub-array 330 comprises a "data in" register 461, a data array memory 462, a selector logic 463, a multiplexer 465, and a data out register 466. The "data in" register 461 receives input data from the NBO input multiplexer 370 and the processor bus 350. The sequencer 308 is coupled to the data array memory 462 and provides a particular write address for writing data to the data array memory 462. Input data is buffered in register 461 prior to being written to memory 462.

As mentioned above, access to stored data is performed using a control word provided by the control store array logic 305. The multiplexer 465 is coupled to the selector logic 463 and controlled by the current control word from the control store array logic 305. The control word addresses the memory 462 to access a particular data word. The retrieved data as well as the input data are applied to the multiplexer 465. The selector logic 463 maps the control word into a selection signal that selects one of the multiplexer inputs for output to the register 466. The selector logic 463 also provides a output timing signal to the register 466. The output from the register 466 is coupled to the data array bus 340.

Figure 5:
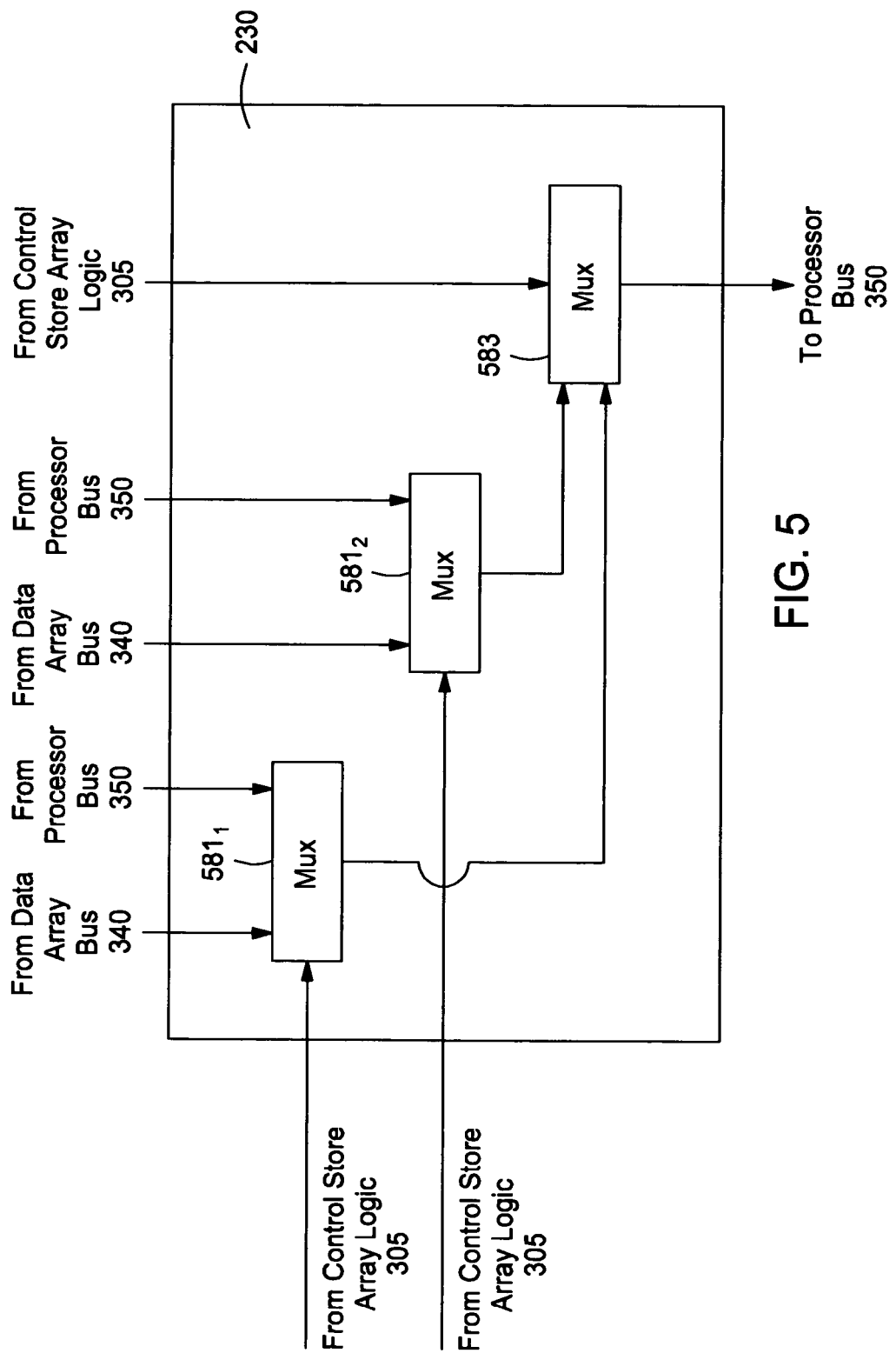
FIG. 5 is a block diagram of a processor.

FIG. 5 is a block diagram of a processor 230. The processor comprises a pair of multiplexers $581_1$ and $581_2$ and a third multiplexer 583. The processor 230 receives multiple inputs from the data array bus 340 and the processor bus 350. A first pair of inputs from a data array bus 340 and a processor bus 350 are selected at a multiplexer $581_1$. A second pair of inputs from a data array bus 340 and a processor bus 350 are selected at a multiplexer $581_2$. An input from the control store array logic 305 is selected at a third multiplexer 583 using the outputs from multiplexers $581_1$ and $581_2$. The output of the third multiplexer 583 is transferred out of the processor through the processor bus 350.

The processor 230 is a fundamental component of the emulation engine 200. The processor's primary function is to execute an N-input logical function (where N is an integer) and produce a function bit out during each step of the sequencer 308. The inputs for each logic function can be selected from a variety of sources, including bits stored from a previous operation, or from another one or more processors. The resulting function bit out may correspond to any one of: a logic gate output of the emulated design, a register output of the emulated design, a synthesized intermediate logic state, or a control bit generated for the emulation process. Additional common operations performed by the processor 230 during an emulation step include storing the function bit out for subsequent use by the processor, capturing and storing external (to the processor) data, receiving data from another processor, and latching data for use by another processor.

A benefit of the present invention is that the depth of the control store word stack can be increased, while the size of the data array does not increase. The illustrative embodiments show an cycle length increase of 25 to 37.5% will not result in an increase in the present amount of data array memory. This allows the hardware emulator to have a deeper control store word stack, emulate more steps per cycle, without an increase in the size of the data array within the hardware emulator.

While the foregoing is directed to embodiments of the present invention, other and further embodiments of the invention may be devised without departing from the basic scope thereof, and the scope thereof is determined by the claims that follow. While the foregoing is directed to embodiments of the present invention, other and further embodiments of the invention may be devised without departing from the basic scope thereof, and the scope thereof is determined by the claims that follow.

What is claimed is:

1. An apparatus for emulating hardware comprising:
a data array having a plurality of sub-arrays where at least one first sub-array has a first depth that stores a first amount of data and at least one second sub-array has a second depth that stores a second amount of data, where said first amount of data is greater than said second amount of data, and where the first depth equals the number of steps in an emulation cycle;
control store array logic configured to provide control words; and
a plurality of processors coupled to the data array and the control store array logic, the plurality of processors configured to emulate logic functions of the hardware defined by the control words, the logic functions processing data stored in said data array;
wherein the second depth for each of the at least one second sub-array is set based on a probability that data stored in the data array will be requested by a processor in the plurality of processors after a selected number of the steps in the emulation cycle.

2. The apparatus of claim 1, wherein the processor comprises a memory having a depth equal to the first depth of the at least one first sub-array.

3. The apparatus of claim 1 wherein the data array has one write port and a plurality of read ports.

4. The apparatus of claim 1 further comprising a sequencer for providing a write address to the data array.

5. The apparatus of claim 1 wherein the first and second sub-arrays have a common input data.

6. The apparatus of claim 1 wherein the data array comprises four sub-arrays.

7. The apparatus of claim 6 wherein a first sub-array has a depth of Y words, a second, third and fourth sub-arrays have a depth of Y/2 words.

8. The apparatus of claim 6 wherein first and second sub-arrays has a depth of Y words and third and fourth sub-arrays have a depth of Y/2 words.

9. The apparatus of claim 6 wherein the first sub-array has a depth of Y words, the second sub-array has a depth of ¾ Y words, the third sub-array has a depth of ½ Y words and the fourth sub-array has a depth of ¼ Y words.

10. An apparatus for emulating hardware comprising:
a data array having a plurality of sub-arrays where at least one first sub-array has a first depth that stores a first amount of data and at least one second sub-array has a second depth that stores a second amount of data, where said first amount of data is greater than said second amount of data, and where the first depth equals the number of steps in an emulation cycle;
a plurality of processors coupled to the data array;
a control store array logic for providing control words to the data array and the plurality of processors; and
a sequencer for providing timing to the control store array logic;
wherein the plurality of processors is configured to emulate logic functions of the hardware defined by the control words, the logic functions processing data stored in said data array; and
wherein the second depth for each of the at least one second sub-array is set based on a probability that data stored in the data array will be requested by a processor in the plurality of processors after a selected number of the steps in the emulation cycle.

11. The apparatus of claim 10, wherein the processor comprises a memory having a depth equal to the first depth of the at least one first sub-array.

12. The apparatus of claim 10 wherein the data array has one write port and a plurality of read ports.

13. The apparatus of claim 10 wherein the sequencer is configured to provide a write address to the data array.

14. The apparatus of claim 10 wherein the first and second sub-arrays have a common input data.

15. The apparatus of claim 10 wherein the data array comprises four sub-arrays.

16. A method for emulating hardware comprising:
configuring a plurality of processors to emulate logic functions of the hardware;
supplying data from the plurality of processors to a write port of each of a plurality of sub-arrays, wherein the plurality of sub-arrays comprises a first sub-array and at least one second sub-array, the first sub-array having a first depth for storing a first amount of data and the at least one second sub-array each having a second depth for storing a second amount of data, wherein the first amount of data is greater than the second amount of data, where the first depth equals the number of steps in an emulation cycle, and where the second depth for each of the at least one second sub-array is set based on a probability that data stored in the plurality of sub-arrays will be requested by a processor in the plurality of processors after a selected number of the steps in the emulation cycle;
accessing the data stored in the first sub-array and the at least one second sub-array; and
processing the accessed data at the logic functions in the plurality of processors.

17. The method of claim 16, wherein each processor in the plurality of processors comprises a memory having a depth equal to the first depth of the at least one first sub-array.

18. The method of claim 17 wherein the plurality of sub-arrays supports an increase in emulation cycles without increasing the size of the memory.

19. The method of claim 16 wherein the data array has one write port and a plurality of read ports.

20. The method of claim 16 further comprising sequentially providing a write address to the data array to simultaneously store data from each processor in the plurality of processors into the first sub-array and the at least one second sub-array.

21. The method of claim 16 wherein the first sub-array and the at least one second sub-array have a common input data.

22. The method of claim 16 wherein the accessing step further comprises:
attempting to access data in the at least one second sub-array; and
if the data is not available in the at least one second sub-array, accessing the data in the first sub-array.

* * * * *